United States Patent
Jung

(10) Patent No.: US 8,000,160 B2
(45) Date of Patent: Aug. 16, 2011

(54) SEMICONDUCTOR DEVICE AND CELL PLATE VOLTAGE GENERATING APPARATUS THEREOF

(75) Inventor: Ho Don Jung, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 472 days.

(21) Appl. No.: 12/206,865

(22) Filed: Sep. 9, 2008

(65) Prior Publication Data

US 2009/0206918 A1    Aug. 20, 2009

(30) Foreign Application Priority Data

Feb. 14, 2008  (KR) .................. 10-2008-0013675
Jun. 27, 2008  (KR) .................. 10-2008-0061951

(51) Int. Cl.
*G11C 29/00* (2006.01)

(52) U.S. Cl. ............ 365/201; 365/189.09; 365/228; 365/226; 365/149

(58) Field of Classification Search .......... 365/149, 365/150, 201, 189.09, 189.11, 228, 226
See application file for complete search history.

(56) References Cited

U.S. PATENT DOCUMENTS

| 6,778,460 B1* | 8/2004 | Jung | 365/227 |
| 7,675,331 B2* | 3/2010 | Jung | 327/143 |
| 7,688,647 B2* | 3/2010 | Jung | 365/189.09 |
| 7,898,317 B2* | 3/2011 | Choi | 327/535 |

FOREIGN PATENT DOCUMENTS

| KR | 1019930008886 B1 | 9/1993 |
| KR | 1020040059461 A | 7/2004 |
| KR | 1020050079537 A | 8/2005 |

* cited by examiner

*Primary Examiner* — Andrew Q Tran
(74) *Attorney, Agent, or Firm* — Ladas & Parry LLP

(57) ABSTRACT

A semiconductor device includes a monitor voltage transfer unit and a voltage generating unit. The monitor voltage transfer unit selects one of a plurality of internal voltages including a cell plate voltage in accordance with a test mode to output it to a voltage monitor pad or outputs an external voltage supplied from the voltage monitor pad as a first pre cell plate voltage. The voltage generating unit generates the cell plate voltage using any one of the first pre cell plate voltage and a second pre cell plate voltage generated within itself in accordance with the test mode. The semiconductor device can generate a pre cell plate voltage at the desired level.

16 Claims, 8 Drawing Sheets

SEMICONDUCTOR DEVICE AND CELL PLATE VOLTAGE GENERATING APPARATUS THEREOF

CROSS-REFERENCE TO RELATED APPLICATIONS

The present application claims priority to Korean patent application number 10-2008-0013675 and 10-2008-0061951 filed on Feb. 14, 2008 and Jun. 27, 2008, which is incorporated herein by reference in its entirety.

BACKGROUND OF THE INVENTION

The present invention relates to a semiconductor device, and more particularly to a semiconductor device and a cell plate voltage generating apparatus thereof which freely provides a cell plate voltage at a desired level.

As developments in semiconductor technology lead to more compact semiconductor devices, the number of net dies increase, and as a result test time also increases. A multi-parallel test must therefore be performed in order to reduce the amount of test time.

A multi-parallel test method performs access to semiconductors simultaneously, and accordingly the multi-parallel test can reduce test time. However, the test equipment used in the multi-parallel test method must secure a number of channels that is equal to the number of channels of the semiconductor devices. However, a higher cost is associated with a large number of channels with regards to the test equipment. Accordingly, there is a desire to overcome a problem occurring when there is a lack of channels in test equipment, which is typically due to the high cost associated with large number of channels.

It is possible to conduct the multi-parallel test while reducing the number of internal voltage pins that require voltage monitoring (which may be a major cause of the lack of channels). A voltage monitor pad can be used to reduce the number of internal voltage pads.

FIG. 1 shows a block diagram of a conventional semiconductor device.

Referring to FIG. 1, the semiconductor device includes: a voltage monitor pad VM; a monitor voltage selecting unit 10 which receives a test mode signal and a plurality of internal voltages and which selects one of the plurality of internal voltages and outputs the selected internal voltage to the voltage monitor pad; and a cell plate voltage generating unit 20 that generates a cell plate voltage in response to a test mode signal.

The monitor voltage selecting unit 10 comprises a decoding signal generating unit 12 and a transfer unit 14. The decoding signal generating unit 12 receives an enable signal EN_DEC, which enables the decoding signal generating unit 12, and a test mode signal TCM<0:2>. The decoding signal generating unit 12 outputs a decoding signal DEC<0:5> used for selecting one of the internal voltages by decoding the internal voltage signals. The transfer unit 14 receives a plurality of internal voltages VCP, VPP, VCORE, VBLP, VREFC, and VREFP and selects one of the internal voltages in response to the decoding signal DEC<0:5>. The transfer unit transfers the selected internal voltage to the voltage monitor pad VM.

The cell plate voltage generating unit 20 comprises: a pre cell plate voltage generating unit 22 that receives a test mode signal TVCP<0:3> and generates a pre cell plate voltage PREVCP in accordance with the test mode; and a driver 24 that receives the pre cell plate voltage PREVCP and amplifies and drives the pre cell plate voltage PREVCP to output the cell plate voltage VCP. The test mode signal TVCP<0:3> is a signal for changing the level of the pre cell plate voltage PREVCP.

FIG. 2 is a detailed circuit diagram showing the decoding signal generating unit 12 of FIG. 1. FIG. 3 is a detailed circuit diagram showing the transfer unit 14 of FIG. 1. Referring to FIG. 2 and FIG. 3, the decoding signal generating unit 12 generates control signals CTRL_DEC<0:2> using a plurality of NAND gates ND1, ND2, ND3 and a plurality of inverters INV1, INV2, INV3 in accordance with the enable signal EN_DEC and the test mode signal TCM<0:2>. The decoding signal generating unit 12 generates decoding signals DEC<0:5> using a plurality of NAND gates ND4 to ND9 and a plurality of inverters INV4 to INV9 in accordance with control signals CTRL_DEC<0:2>. The control signals CTRL_DEC<0:2> inputted to the NAND gates ND4 to ND9 enable only one decoding signal by combining the control signals CTRL_DEC<0:2> with inverted control signals CTRL_DECB<0:2> in a specific manner. For example, when the signals CTRL_DECB<0>, CTRLDECB<1>, CTRL_DECB<2> that are input to the NAND gate ND4 are each at a high level, the decoding signal DEC <0> is enabled and the remaining decoding signals DEC <1:5> are disabled. As such, only transfer gate TG0 (FIG. 3) is opened, and thus the cell plate voltage VCP is applied to the voltage monitor pad VM. Therefore, when using the test equipment it is possible to monitor the level of the cell plate voltage via the voltage monitor pad VM. The cell plate voltage VCP is generated and outputted by the cell plate voltage generating unit 20. However, the cell plate voltage VCP is inputted to the voltage monitor pad VM via the transfer gate TG0, and therefore the cell plate voltage's VCP drivability is decreased. Accordingly, the cell plate voltage generating unit 20 must have a level setting unit in order to change the level of the cell plate voltage. That is, when a level cell plate voltage is necessary, the level setting circuit, which changes the level of the cell plate voltage using the test mode signal, is separately required. Accordingly, the conventional circuit includes problems, in that the number of signal lines increases due to newly added test mode signals, and the addition of the level setting circuit leads to an increased layout area. Additionally, a test on levels not provided in the test mode is not possible.

FIG. 4 shows part of the conventional cell plate voltage generating unit 20 that includes a level setting circuit.

Referring to FIG. 4, the pre cell plate voltage generating unit 22 includes a level setting unit 26 for setting the level of the pre cell plate voltage, and a voltage dividing unit 28 that outputs the pre cell plate voltage PREVCP by dividing the voltage VCORE in accordance with the set level.

The level setting unit 26 includes a plurality of PMOS transistors PM0, PM1, PM2, PM3 each having an inverted test mode signal TVCP <0:3> supplied to the respective gate thereof. The voltage dividing unit 28 has a plurality of resistors R1, R2, R3, R4, R5, R6 connected in series. A node of each resistor is connected to a drain terminal of a respective one of PMOS transistors PM0, PM1, PM2, PM3 of the level setting unit 26. Therefore, it is possible to adjust the level of the pre cell plate voltage PREVCP by enabling the test mode signal TVCP <3> if a high voltage is required, and enabling the test mode signal TVCP <0> if a low voltage is required.

The pre cell plate voltage PREVCP generated as described above is amplified via the driver 24 and output as the cell plate voltage VCP. A current mirror may be included in the driver 24.

As described above, the conventional cell plate voltage is transferred to the voltage monitor pad using the transfer gate, and therefore the drivability of the cell plate voltage decreases, and thus a voltage level setting unit is required.

SUMMARY OF THE INVENTION

The present invention provides a semiconductor device which can generate a pre cell plate voltage at a desired level using a cell plate voltage generating unit and that applies the generated pre cell plate voltage to a voltage monitor pad.

The present invention also provides a semiconductor device which can adjust the level of the pre cell plate voltage in response to a decoding signal generated in accordance with a test mode signal.

A semiconductor device according to an embodiment of the present invention comprises a monitor voltage transfer unit outputting an internal voltage to a voltage monitor pad in accordance with a test mode, or supplying an external voltage from the voltage monitor pad and outputting a first pre cell plate voltage in accordance with the test mode, and a voltage generating unit generating a pre cell plate voltage by using either the first pre cell plate voltage or a second pre cell plate voltage generated within itself in accordance with the test mode.

Preferably, the monitor voltage transfer unit comprises a decoding signal generating unit combining an enable signal, with a test mode signal to generate a first and a second decoding signal which determines the test mode, and a transfer unit transferring the internal voltage to the voltage monitor pad in response to the first decoding signal, or transferring the external voltage supplied from the monitor pad as the second pre cell plate voltage to the voltage generating unit in response to the second decoding signal.

Preferably, the decoding signal generating unit comprises a decoding control signal generating unit combining the enable signal with the test mode signal to generate decoding control signals and a decoder combining the decoding control signals to output the first and the second decoding signal.

Preferably, the voltage generating unit comprises a pre cell plate voltage generating unit selectively generating the second pre cell plate voltage in response to the second decoding signal; and a driver amplifying and driving the first pre cell plate voltage or the second pre cell plate voltage to generate the cell plate voltage. Preferably, the pre cell plate voltage generating unit generates the second pre cell plate voltage by selectively distributing a core voltage in response to the second decoding signal.

Preferably, the pre cell plate voltage generating unit comprises a first switching unit switching a supply of the core voltage in response to the second decoding signal and a second switching unit switching a supply of a ground voltage in response to the second decoding signal an output node formed between the first switching unit and the second switching unit to output the second pre cell plate voltage, and the first pre cell plate voltage is selectively supplied to the output node via the transfer unit.

Preferably, the external voltage is supplied from the outside to the voltage monitor pad to control a level of the cell plate voltage at a desired level according to a test specification.

A semiconductor device according to another embodiment of the present invention comprises a decoding signal generating unit combining an enable signal with a test mode signal to generate a decoding signal, a voltage providing unit providing an internal voltage including at least a cell plate voltage or a pre cell plate voltage in response to the decoding signal, a voltage monitor pad receiving the internal voltage provided to the voltage providing unit and an external voltage to use as the pre cell plate voltage, and a driver driving the pre cell plate voltage to generate the cell plate voltage.

Preferably, the voltage providing unit providing the pre cell plate voltage generated within itself in response to the decoding signal, or providing the pre cell plate voltage corresponding to the external voltage in response to the decoding signal.

Preferably, the voltage providing unit comprises a pre cell plate voltage generating unit selectively generating the pre cell plate voltage in response to the decoding signal and outputting the pre cell plate voltage to the driver, and a transfer unit transferring the internal voltage to the voltage monitor pad in response to the decoding signal, or transferring the external voltage to an output terminal of the voltage generating unit in response to the decoding signal.

Preferably, the cell plate voltage generating apparatus comprises a transfer gate connecting the pre cell plate voltage generating unit to the voltage pad when the control signal is enabled.

Preferably, the pre cell plate voltage generating unit generates the pre cell plate voltage by selectively distributing a core voltage in response to the decoding signal.

Preferably, the pre cell plate voltage generating unit comprises a first switching unit switching a supply of the core voltage in response to the decoding signal and a second switching unit switching a supply of a ground voltage in response to the decoding signal, the output terminal is formed between the first and second switching units to output the pre cell plate voltage, and the external voltage is selectively supplied to the output terminal via the transfer unit.

Preferably, the external voltage is supplied from the outside to the voltage monitor pad to control a level of the cell plate voltage at a desired level according to a test specification.

A cell plate voltage generating unit according to another embodiment of the present invention comprises a pre cell plate voltage generating unit that receives a test signal, wherein: when the test signal is disabled, the pre cell plate voltage generating unit receives an internal voltage and generates a pre cell plate voltage, and when the test signal is enabled, the pre cell plate voltage generating unit generates the pre cell plate voltage corresponding to the external voltage supplied via a voltage pad; and a driver driving the pre cell plate voltage to generate a cell plate voltage.

Preferably, the cell plate voltage generating device further comprises a transfer gate connecting an output node of the pre cell plate voltage generating unit to the voltage pad when the test signal is enabled.

Preferably, the pre cell plate voltage generating unit comprises a voltage dividing unit dividing the internal voltage, and a control unit causing the voltage dividing unit to float the internal voltage when the test signal is enabled.

DESCRIPTION OF SPECIFIC EMBODIMENTS

A semiconductor device according to the present invention can monitor various internal voltages in accordance with the test mode, and, if necessary, the semiconductor device can adjust the level of these voltages directly from outside the device.

Figure 1:
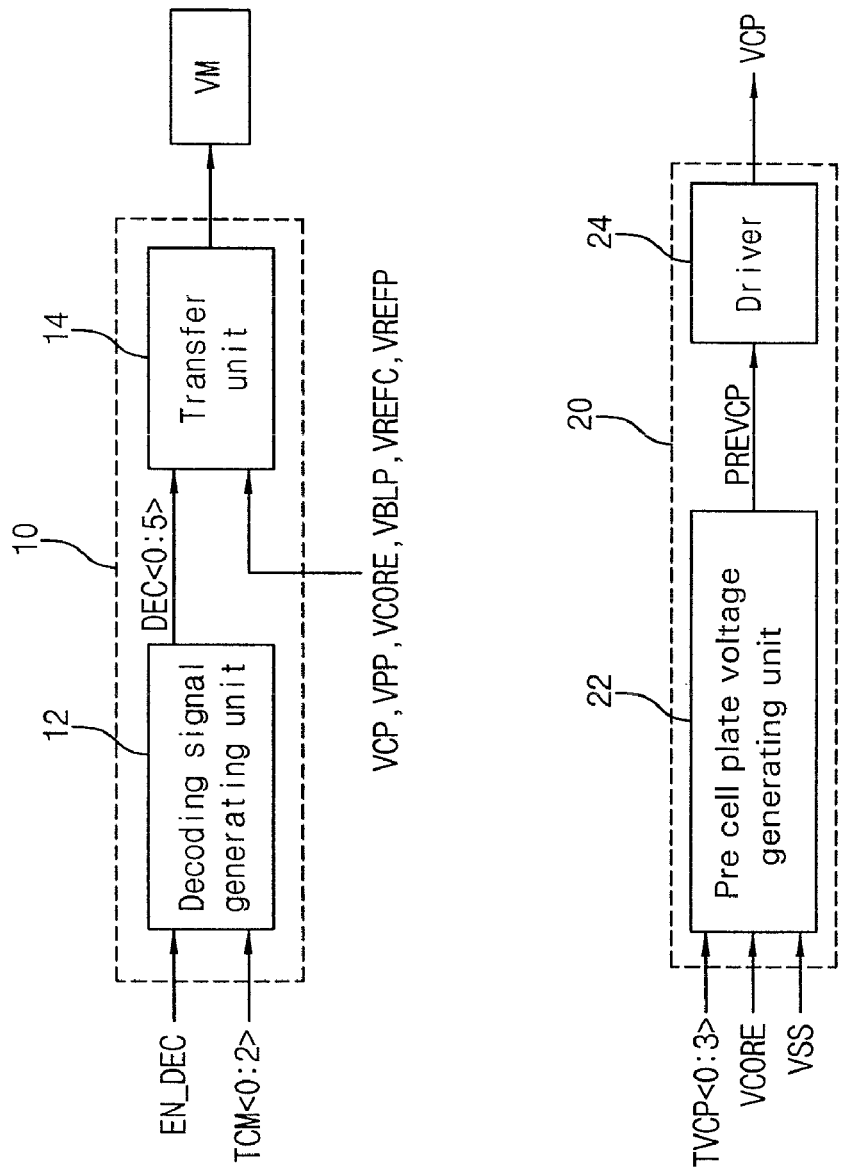
FIG. 1 is a block diagram showing a conventional semiconductor device.
Figure 2:
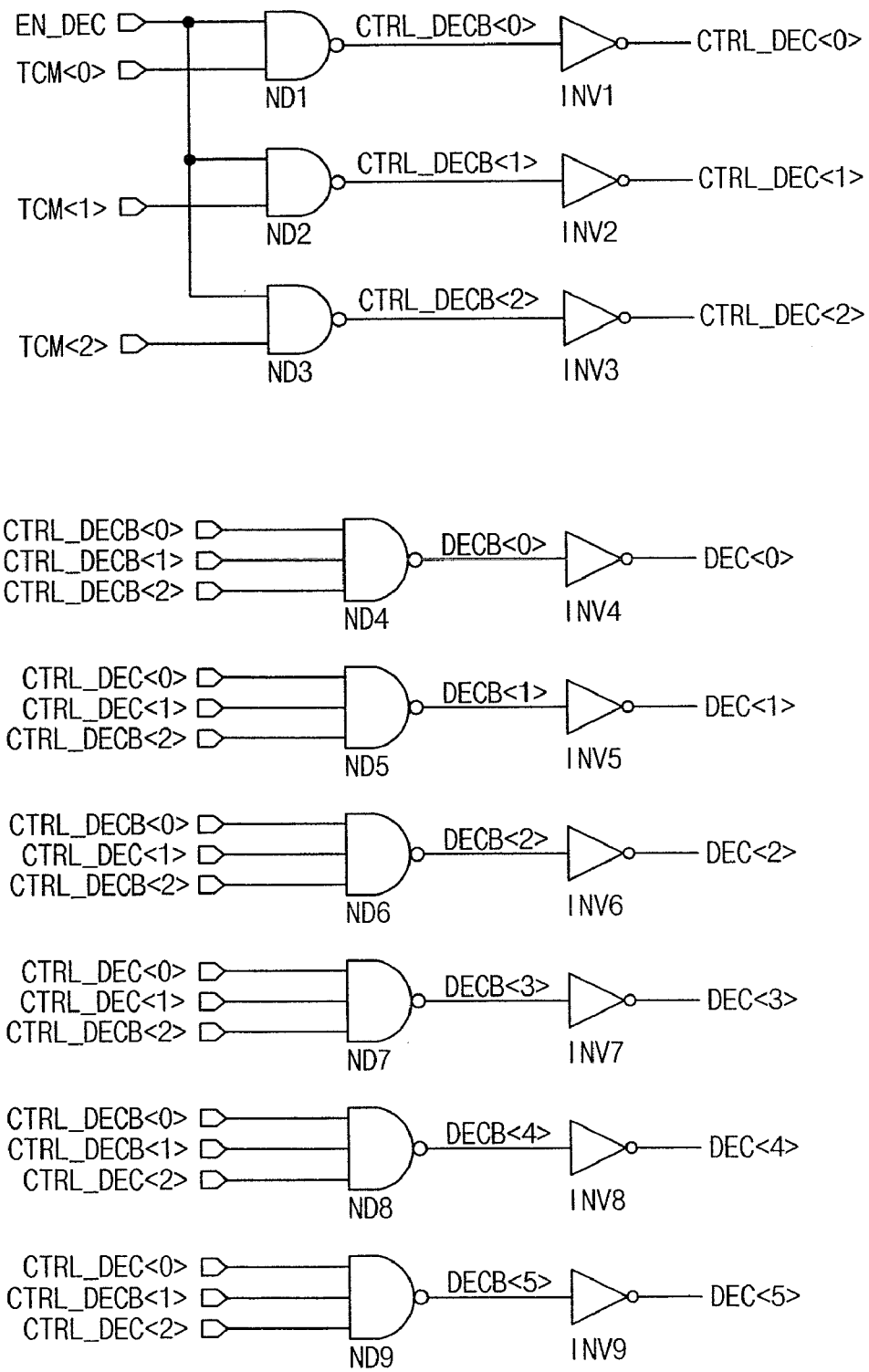
FIG. 2 is a detailed circuit diagram showing the decoding signal generating unit of FIG. 1.
Figure 3:
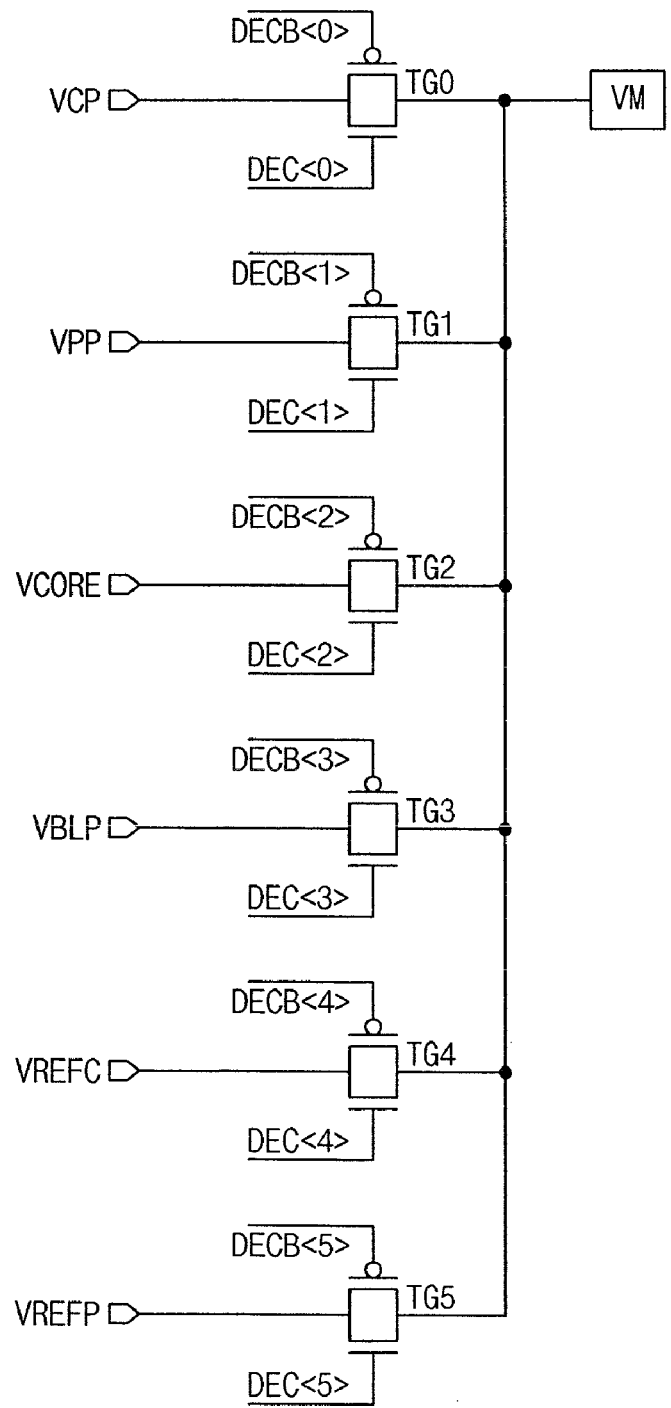
FIG. 3 is a detailed circuit diagram showing the transfer unit of FIG. 1.
Figure 4:
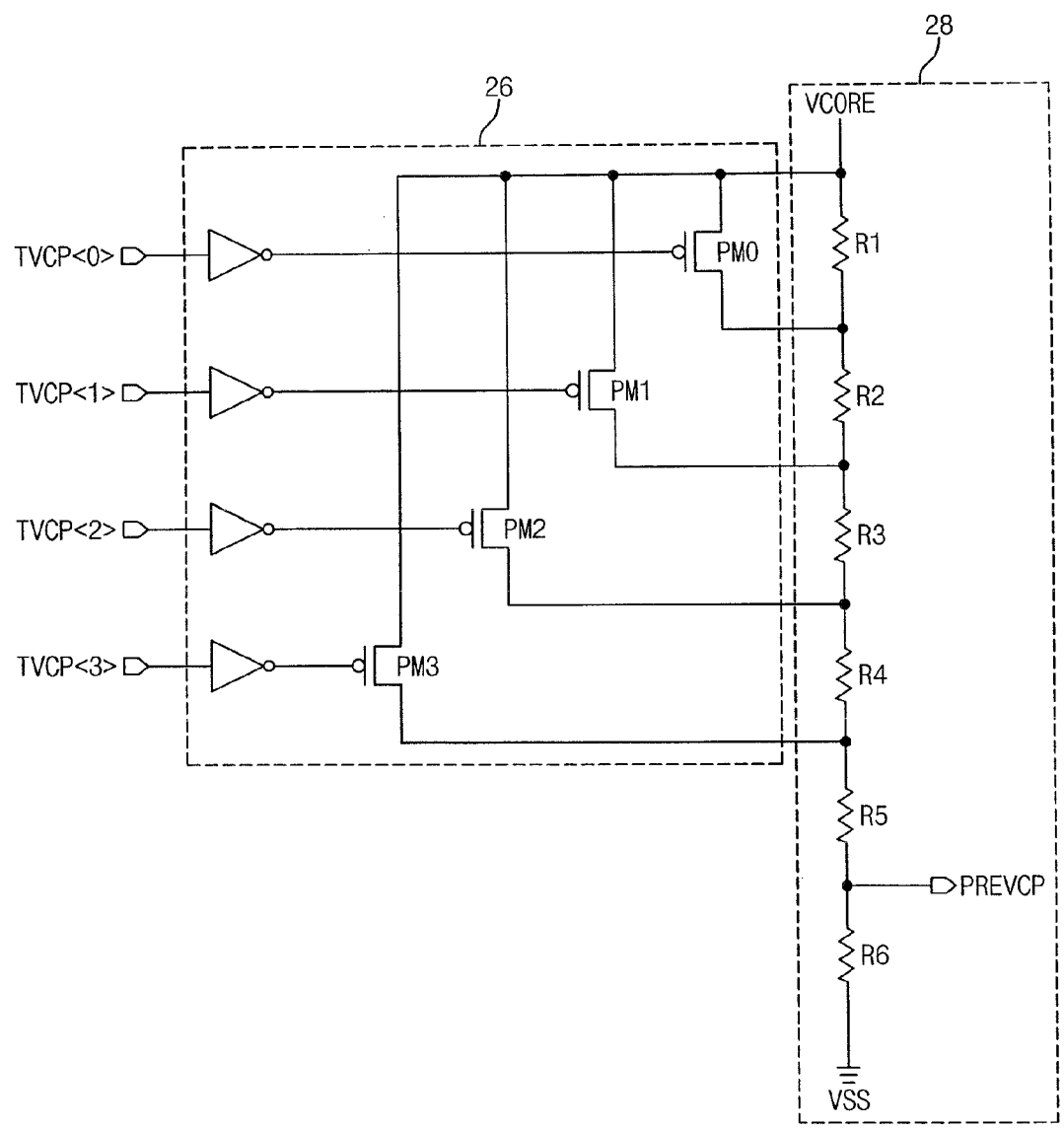
FIG. 4 is a detailed circuit diagram showing the pre cell plate voltage generating unit of FIG. 1.
Figure 5:
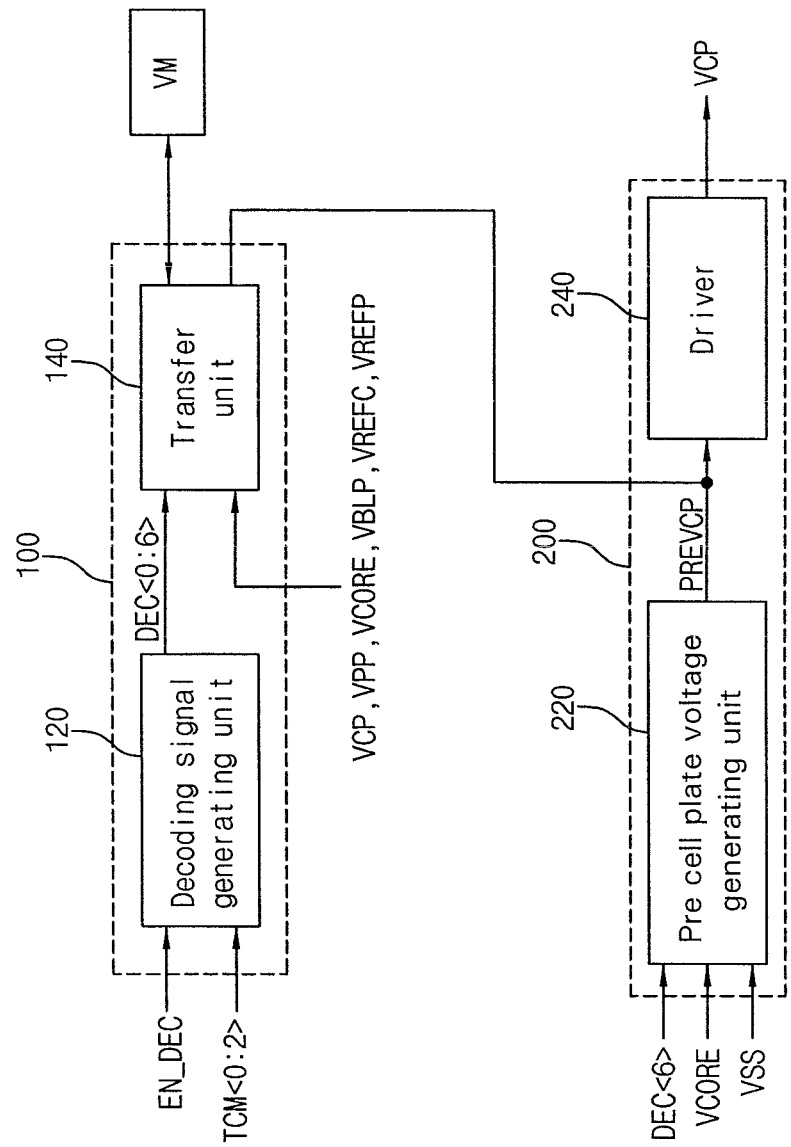
FIG. 5 is a block diagram showing a semiconductor device according to the present invention.

Hereinafter, preferred embodiments of the present invention will be described in detail with reference to the accompanying drawings. FIG. 5 shows a block diagram of the semiconductor device according to the present invention.

Referring to FIG. 5, the semiconductor device comprises: a monitor voltage transfer unit 100, which generates a decoding signal DEC<0:6> corresponding to a test mode, selects any one of a plurality internal voltages VCP, VPP, VCORE, VBLP, VREFC, and VREFP in response to the decoding signals DEC<0:6> to transfer it to a voltage monitor pad VM, and transfers an external voltage provided from the voltage monitor pad VM to a cell plate voltage generator unit, and a cell plate voltage generating unit 200 which generates the cell plate voltage VCP in response to a decoding signal DEC<6>. Herein, 'VCP' refers to a cell plate voltage, 'VPP' refers to a pumping voltage, and 'VCORE' refers to a core voltage. Further, 'VBLP' refers to a bit line precharge voltage and 'VREFC' refers to a reference level of the high voltage. The level of the internal voltage that is applied to the voltage monitor pad can be monitored by connecting the voltage monitor pad VM to test equipment. Particularly, the external voltage is supplied from the outside to the voltage monitor pad VM to control the cell plate voltage VCP at a desired level according to the test specification and can be directly applied to the cell plate voltage generating unit 200 via the voltage monitor pad VM.

The monitor voltage transfer unit 100 comprises a decoding signal generating unit 120 and a transfer unit 140. The decoding signal generating unit 120 receives an enable signal EN_DEC and a test mode signal TCM<0:2> to output a decoding signal DEC<0:6>. The enabling signal EN_DEC is to enabled the decoding signal generating unit 120, and the test mode signal TCM<0:2> is to select any one of a plurality of internal voltages VCP, VPP, VCORE, VBLP, VREFC, and VREFP and the external voltage supplied from the voltage monitor pad VM in accordance with the test mode. The transfer unit 140 receives the internal voltages VCP, VPP, VCORE, VBLP, VREFC, VREFP, PREVCP and selects one of the internal voltages to transfer it to the voltage monitor pad VM in response to the decoding signal DEC<0:5>. Further, the transfer unit 140 receives the external voltage applied via the voltage monitor pad VM and transfers it to the cell plate voltage generating unit 200 in response to the decoding signal DEC<6>.

The cell plate voltage generating unit 200 comprises: a pre cell plate voltage generating unit 220 which selectively generates the pre cell plate voltage PREVCP in accordance with a state of the decoding signal DEC<6>; and a driver 240, which receives, amplifies, and drives an output signal (the pre cell plate voltage PREVCP) from the pre cell plate voltage generating unit 220 or the pre cell plate voltage PREVCP supplied by the transfer unit 140 to output the cell plate voltage VCP. The cell plate voltage VCP is transferred to the voltage monitor pad VM via the monitor voltage transferring unit 100. Herein, the driver 240 can include a current mirror amplifying the pre cell plate voltage PREVCP.

Figure 6:
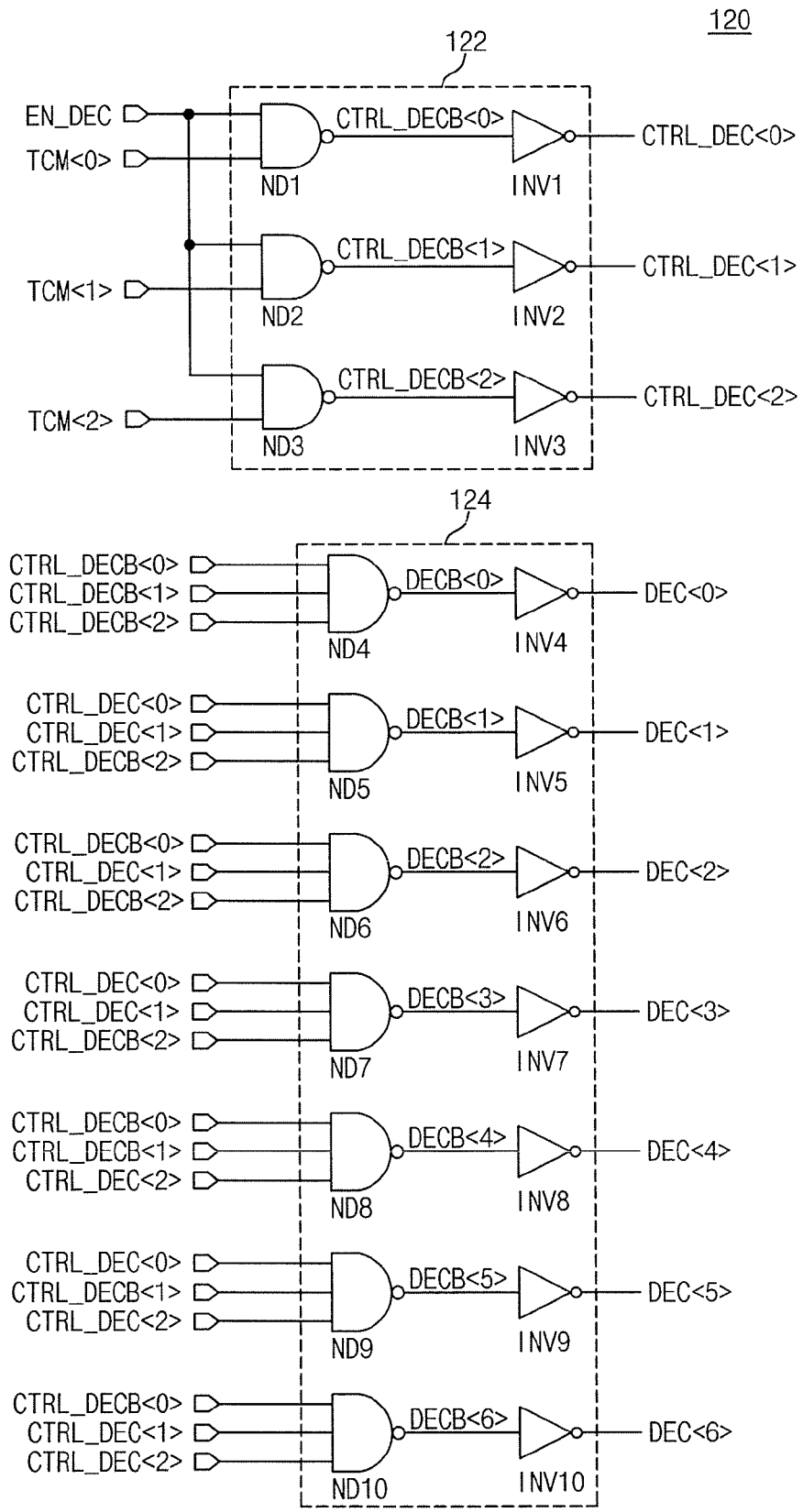
FIG. 6 is a detailed circuit diagram showing the decoding signal generating unit of FIG. 5.

FIG. 6 is a detailed circuit diagram showing the decoding signal generating unit 120 of FIG. 5. Referring to FIG. 6, the decoding signal generating unit 120 comprises: a decoder control unit 122, which outputs decoder control signals CTRL_DEC<0:2> by combining the enable signal EN_DEC with the test mode signals TCM<0:2>; and a decoder 124 which outputs decoding signals DEC<0:6> in accordance with the decoder control signals CTRL_DEC<0:2>. The decoder control unit 122 comprises a plurality of NAND gates ND1, ND2, ND3 each receiving the enable signal EN_DEC as a common input, and each receiving a respective test mode signal TCM <0:2> as an individual input. The decoder control unit 122 also comprises a plurality of inverters INV1, INV2, INV3. The decoder 124 comprises a plurality of NAND gates ND4 to ND10 for generating the decoding signals DEC<0:6>. The decoder 124 receives the decoding control signals CTRL_DEC<0:2> as an input. The decoder 124 also comprises a plurality of inverters IN4 to INV10. The decoder 124 allows only one of the decoding signals DEC<0:6> to be enabled by combining the decoder control signal CTRL_DEC<0:2> with inverted decoder control signals CTRL_DECB<0:2> in a specific manner.

Figure 7:
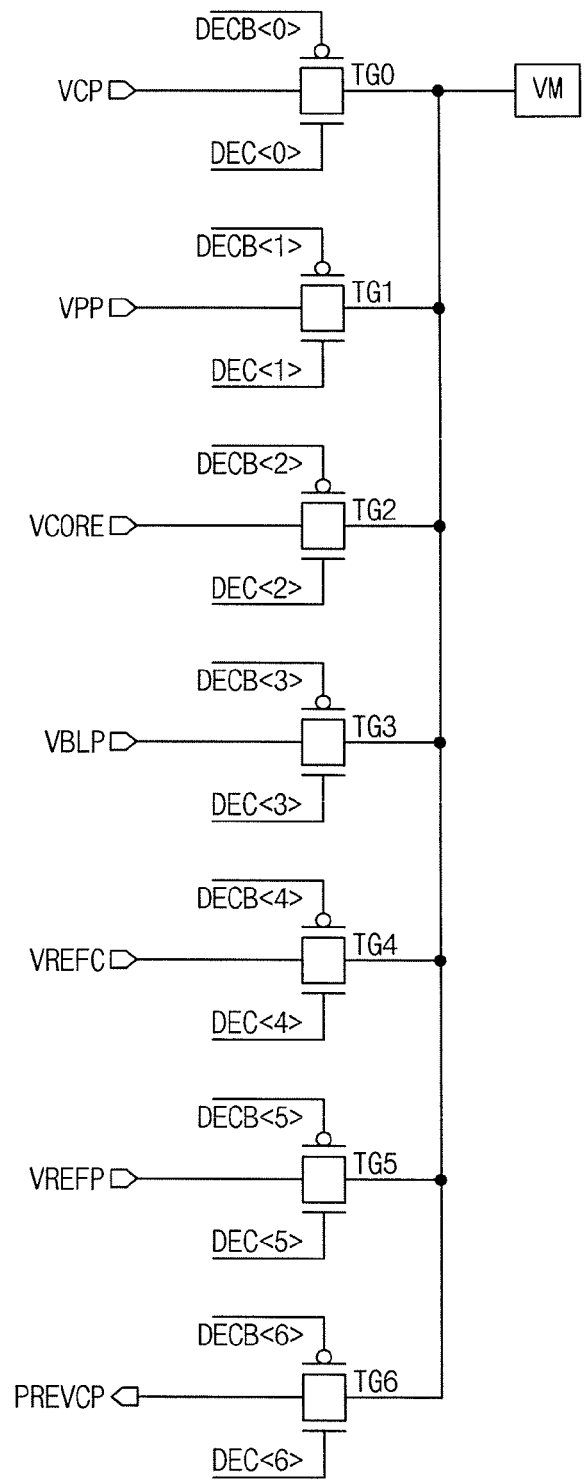
FIG. 7 is a detailed circuit diagram showing the transfer unit of FIG. 5.

FIG. 7 is a detailed circuit diagram showing the transfer unit 140 of FIG. 5. Referring to FIG. 7, the transfer unit 140 comprises a plurality of transfer gates TG0 to TG6, each of which transfers the internal voltages VCP, VPP, VCORE, VBLP, VREFC, and VREFP and which is controlled by the decoding signals DEC<0:5> to be input to the voltage monitor pad VM; and a transfer gate TG6 which transfers the external voltage controlled by the decoding signal DEC<6> and input via the voltage monitor pad VM, to the cell plate voltage generating unit 200. If the decoding signal DEC<6> is enabled, the external voltage is received from the voltage monitor pad VM and is supplied to the cell plate voltage generating unit 200 as the pre cell plate voltage PREVCP.

Figure 8:
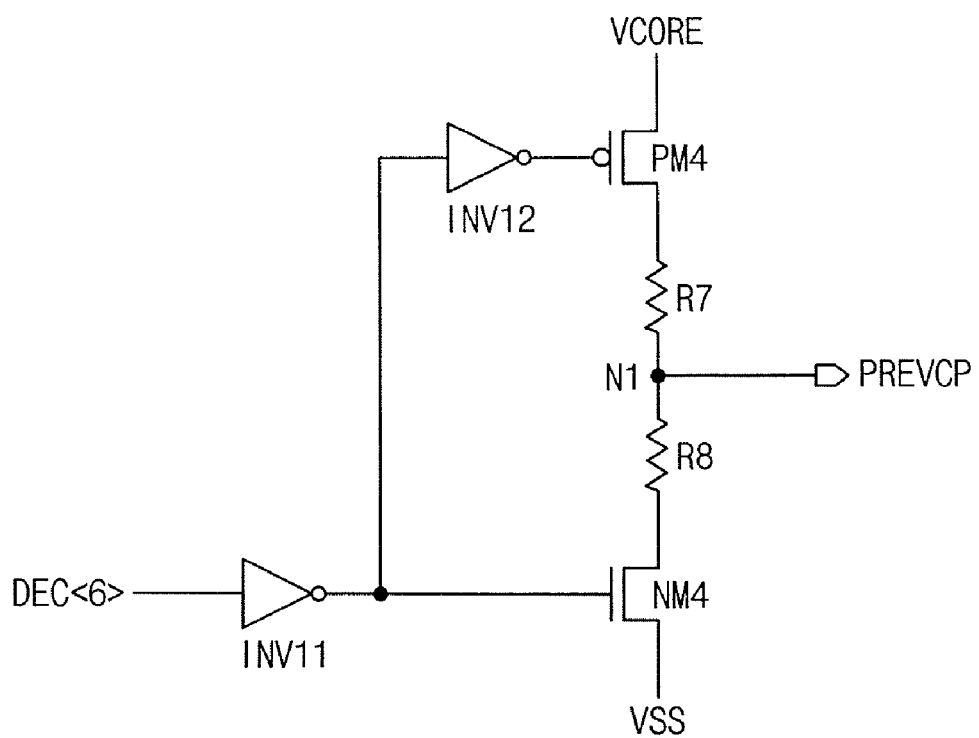
FIG. 8 is a detailed circuit diagram showing the pre cell plate voltage generating unit of FIG. 5.

Referring to FIG. 8, the pre cell plate voltage generating unit 220 comprises: an inverter IVN11, which receives the decoding signal DEC<6> from the decoder 124; an inverter INV12, which receives the output signal of the inverter INV11; an NMOS transistor NM4, which receives the output signal of the inverter INV11 as a gate input; a PMOS transistor PM4, which receives the output signal of the inverter INV12 as a gate input; and resistor elements R7 and R8 connected in series between the MOS transistors PM4 and NM4. The pre cell plate voltage PREVCP is output from node N1 formed between the resistor elements R7 and R8.

The source terminal of the PMOS transistor PM4 is connected to the core voltage VCORE, and the source terminal of the NM0S transistor NM4 is connected to the ground voltage VSS.

The MOS transistors PM4, NM4 are turned on when the decoding signal DEC<6> is disabled, and therefore it is possible to generate the pre cell plate voltage by distributing the core voltage VCORE. Conversely, the MOS transistors PM4, NM4 are turned off when the decoding signal DEC<6> is enabled, and in this case the voltage sources VCORE, VSS are floated. At this time, (when the decoding signal DEC<6> is enabled), the node N1 is connected to the voltage monitor pad VM via the transfer gate TG6. Therefore, the desired level of voltage can be freely applied via the voltage monitor pad VM. That is, it is possible to apply a higher voltage via the voltage monitor pad even though the drivability of the pre cell plate voltage deteriorates.

The pre cell plate voltage PREVCP generated by the above-mentioned method is output as the cell plate voltage VCP via the driver 240.

In the present invention, because it is possible to adjust the level of the pre cell plate voltage PREVCP to a desired level via the voltage monitor pad VM, the cell plate voltage VCP can be also adjusted.

As described above, the present invention allows the level of the cell plate voltage to be adjusted by adding the decoder and the transfer gate connecting the pre cell plate voltage to the voltage monitor pad.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A semiconductor device, comprising:
   a monitor voltage selecting unit outputting an internal voltage including at least a cell plate voltage to a voltage monitor pad in accordance with a test mode, and supplying an external voltage from the voltage monitor pad and outputting a first pre cell plate voltage in accordance with the test mode; and
   a cell plate voltage generating unit generating the cell plate voltage by using either the first pre cell plate voltage or a second pre cell plate voltage generated within the cell plate voltage generating unit in accordance with the test mode.

2. The semiconductor device as set forth in claim 1, wherein the monitor voltage selecting unit comprises:
   a decoding signal generating unit combining an enable signal, with a test mode signal to generate a first and a second decoding signal which determines the test mode; and
   a transfer unit transferring the internal voltage to the voltage monitor pad in response to the first decoding signal, or transferring the external voltage supplied from the voltage monitor pad as the first pre cell plate voltage to the cell plate voltage generating unit in response to the second decoding signal.

3. The semiconductor device as set forth in claim 2, wherein the decoding signal generating unit comprises:
   a decoding control signal generating unit combining the enable signal with the test mode signal to generate decoding control signals; and
   a decoder combining the decoding control signals to output the first and the second decoding signal.

4. The semiconductor device as set forth in claim 2, wherein the cell plate voltage generating unit comprises:
   a pre cell plate voltage generating unit selectively generating the second pre cell plate voltage in response to the second decoding signal; and
   a driver amplifying and driving the first pre cell plate voltage or the second pre cell plate voltage to generate the cell plate voltage.

5. The semiconductor device as set forth in claim 4, wherein the pre cell plate voltage generating unit generates the second pre cell plate voltage by selectively distributing a core voltage in response to the second decoding signal.

6. The semiconductor device as set forth in claim 5, wherein the pre cell plate voltage generating unit comprises:
   a first switching unit switching a supply of the core voltage in response to the second decoding signal;
   a second switching unit switching a supply of a ground voltage in response to the second decoding signal;
   an output node formed between the first switching unit and the second switching unit to output the second pre cell plate voltage, and the first pre cell plate voltage is selectively supplied to the output node via the transfer unit.

7. The semiconductor device as set forth in claim 1, wherein the external voltage is supplied from the outside to the voltage monitor pad to control a level of the cell plate voltage at a desired level according to a test specification.

8. A semiconductor device, comprising:
   a decoding signal generating unit combining an enable signal with a test mode signal to generate a decoding signal;
   a voltage providing unit providing an internal voltage including at least a cell plate voltage or a pre cell plate voltage in response to the decoding signal;
   a voltage monitor pad receiving the internal voltage provided from the voltage providing unit and an external voltage to use as the pre cell plate voltage; and
   a driver driving the pre cell plate voltage to generate the cell plate voltage.

9. The semiconductor device as set forth in claim 8, wherein the voltage providing unit providing the pre cell plate voltage generated within itself in response to the decoding signal, or providing the pre cell plate voltage corresponding to the external voltage in response to the decoding signal.

10. The semiconductor device as set forth in claim 9, wherein the voltage providing unit comprises:
    a pre cell plate voltage generating unit selectively generating the pre cell plate voltage in response to the decoding signal and outputting the pre cell plate voltage to the driver; and
    a transfer unit transferring the internal voltage to the voltage monitor pad in response to the decoding signal, or transferring the external voltage to an output terminal of the pre cell plate voltage generating unit in response to the decoding signal.

11. The semiconductor device as set forth in claim 10, wherein the pre cell plate voltage generating unit generates the pre cell plate voltage by selectively distributing a core voltage in response to the decoding signal.

12. The semiconductor device as set forth in claim 11, wherein the pre cell plate voltage generating unit comprises a first switching unit switching a supply of the core voltage in response to the decoding signal and a second switching unit switching a supply of a ground voltage in response to the decoding signal, the output terminal is formed between the first and second switching units to output the pre cell plate voltage, and the external voltage is selectively supplied to the output terminal via the transfer unit.

13. The semiconductor device as set forth in claim 8, wherein the external voltage is supplied from the outside to the voltage monitor pad to control a level of the cell plate voltage at a desired level according to a test specification.

14. A cell plate voltage generating device, comprising:
    a pre cell plate voltage generating unit that receives a test signal, wherein:
    when the test signal is disabled, the pre cell plate voltage generating unit receives an internal voltage and generates a pre cell plate voltage, and
    when the test signal is enabled, the pre cell plate voltage generating unit generates the pre cell plate voltage corresponding to an external voltage supplied via a voltage pad; and a driver driving the pre cell plate voltage to generate a cell plate voltage.

15. The cell plate voltage generating device as set forth in claim 14, further comprising:
a transfer gate connecting an output node of the pre cell plate voltage generating unit to the voltage pad when the test signal is enabled.

16. The cell plate voltage generating device as set forth in claim 14, wherein the pre cell plate voltage generating unit comprises:
a voltage dividing unit dividing the internal voltage; and
a control unit causing the voltage dividing unit to float the internal voltage when the test signal is enabled.

* * * * *